United States Patent [19]

Henry

[11] 4,074,257
[45] Feb. 14, 1978

[54] AUTO-POLARITY DUAL RAMP ANALOG TO DIGITAL CONVERTER

[75] Inventor: Tim Warren Henry, Tempe, Ariz.

[73] Assignee: Motorola, Inc., Schaumburg, Ill.

[21] Appl. No.: 592,131

[22] Filed: June 30, 1975

[51] Int. Cl.² .............................................. H03K 13/20
[52] U.S. Cl. ...................... 340/347 NT; 340/347 AD
[58] Field of Search ................. 340/347 AD, 347 NT, 340/347 CC

[56] References Cited

U.S. PATENT DOCUMENTS

| | | | |
|---|---|---|---|
| 3,667,055 | 5/1972 | Uchida | 340/347 CC |
| 3,747,089 | 7/1973 | Sharples | 340/347 NT |
| 3,750,146 | 7/1973 | Lucas | 340/347 NT |
| 3,872,466 | 3/1975 | Wold | 340/347 CC |
| 3,906,486 | 9/1975 | Phillips | 340/347 NT |
| 3,930,252 | 12/1975 | Storar | 340/347 NT |

Primary Examiner—Charles D. Miller
Attorney, Agent, or Firm—Joe E. Barbee

[57] ABSTRACT

A dual ramp analog to digital converter which employs a single supply voltage and internal logic circuitry for automatically generating automatic zero and full scale calibration voltages and a virtual second supply voltage of opposite polarity to the single supply voltage for automatically accommodating unknown opposite polarity input voltages to be measured.

12 Claims, 2 Drawing Figures

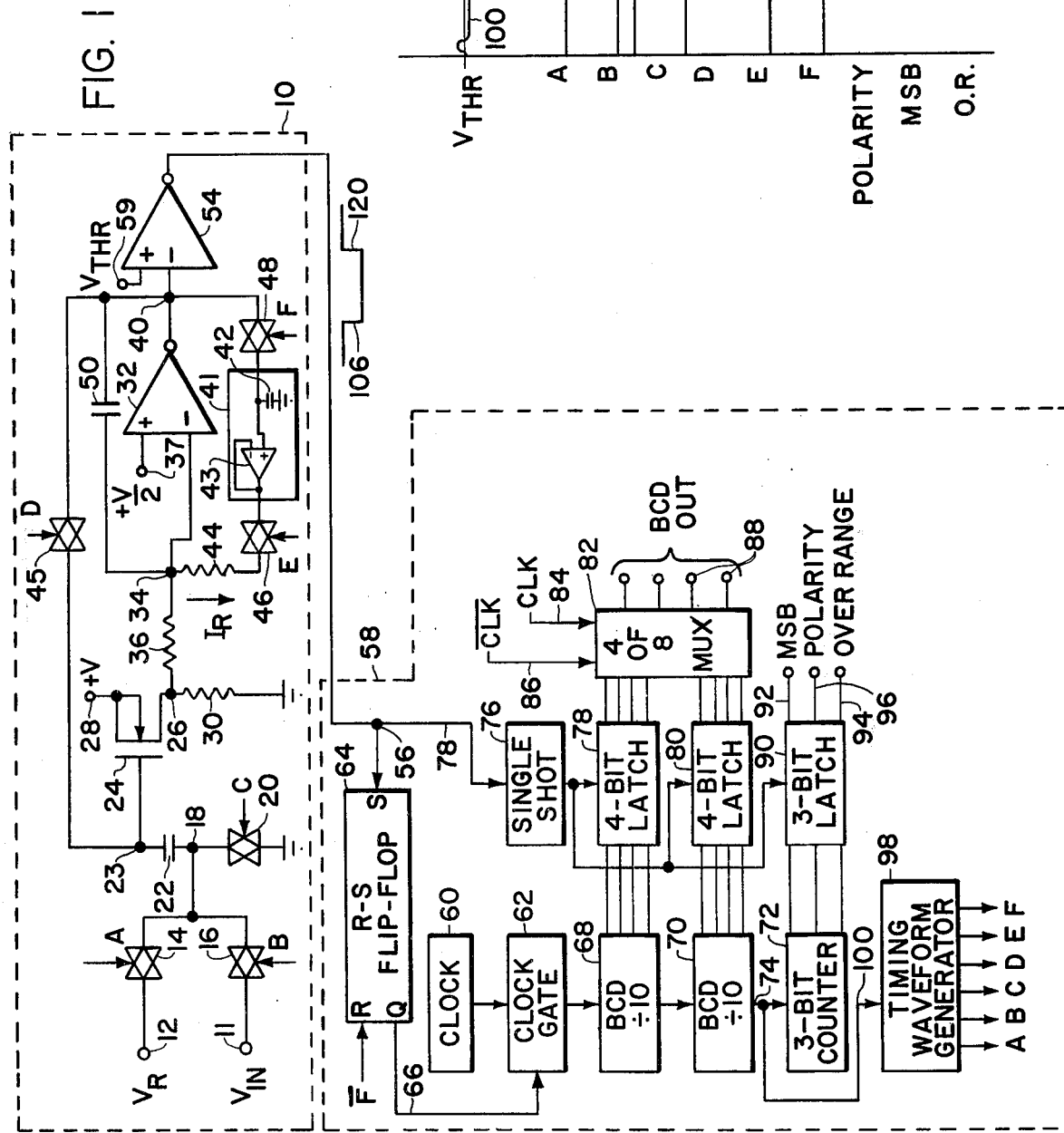

AUTO-POLARITY DUAL RAMP ANALOG TO DIGITAL CONVERTER

BACKGROUND OF THE INVENTION

Dual ramp analog to digital converters are extremely accurate high performance systems. Basically, the approach of integrating a voltage in a first direction for a predetermined time period during the first half of the measuring cycle and then removing charge or integrating in an opposite direction at a predetermined rate during the second phase of the measuring cycle permits supply voltages and device tolerance variations to offset each other. In this manner, the net effect of these tolerance variations is essentially zero and thus accuracy is improved.

Many improvements have been suggested for the basic dual ramp analog to digital converter in order to improve performance and accuracy. However, a major problem still exists in the implementation of a dual ramp analog to digital converter which can economically and efficiently handle unknown analog voltages of positive and negative polarity. The conventional approach is to employ a dual supply system. In any type of implementation errors are introduced if both supplies vary or do not track with respect to each other. Moreover, although some other approaches or solutions are satisfactory in a non-integrated circuit environment, the implementation of a dual ramp analog to digital converter in an integrated circuit poses problems associated with calibration and auto-polarity and single supply capability.

SUMMARY OF THE INVENTION

The present invention provides a high performance dual ramp analog to digital converter which includes internal switching circuitry for providing the following phases: an automatic zero, a full scale calibration, an offset cycle, an up-ramp integration and a down-ramp integration while employing only a single power supply.

DESCRIPTION OF THE DRAWINGS

FIG. 1 shows an electrical schematic block diagram of the dual ramp analog to digital converter of the present invention.

FIG. 2 illustrates waveforms and timing diagrams associated with the operation of the analog to digital converter of FIG. 1.

DESCRIPTION OF THE PREFERRED EMBODIMENT

In the analog portion 10 of the converter an analog unknown voltage, $V_{IN}$, to be digitized and a reference voltage, $V_R$, are received at input terminals 11 and 12, respectively. A pair of transmission gates 14 and 16 are selectively closed in response to timing signals A and B depicted in FIG. 2 in order to couple the input terminals 12 and 11 to an input node 18, respectively. The input node 18 is selectively coupled to ground potential by a transmission gate 20 and its associated timing signal C. An input capacitor 22 and a unity gain source follower 24 are serially interconnected between node 18 and node 26. The source follower in the preferred embodiment is implemented as a MOSFET having its drain terminal connected to a single positive supply voltage +V at terminal 28 and its source terminal connected to ground potential by resistor 30 connected to node 26. The inverting input terminal of a differential operational amplifier 32 is coupled at a node 34 to node 26 by means of resistor 36 and its noninverting threshold input terminal 37 is connected to a threshold voltage +V/2. Coupled across the differential operational amplifier 32 between its input node 34 and its output node 40 is a sample and hold circuit 41. A suitable sample and hold circuit for the present invention would typically include a capacitor 42 coupled to ground potential and which is in turn coupled to a unity gain operational amplifier 43. A transmission gate 45 couples output node 40 to the gate electrode of source follower 24 at node 23 in response to its control signal D. The output side of the sample and hold circuit 41 is connected to node 34 by means of resistor 44 and transmission gate 46 and its associated timing control signal E. The input side of the sample and hold circuit 41 is connected to node 40 by means of transmission gate 48 and its control signal or pulse F. In a conventional manner integrating capacitor 50 is connected across nodes 34 and 40 in order to allow the differential operational amplifier 32 to operate as an integrator i.e., the voltage across capacitor 50 varies linearly with time in order to generate a ramp output voltage at node 40. Finally, the analog portion 10 of the converter includes a differential comparator 54 coupled between node 40, and output terminal 56 for generating an enabling pulse for energizing the converter's digital counting and indicating portion 58 in response to node 40 crossing the threshold voltage established by $V_{THR}$ at noninverting terminal 59.

The digital portion 58 of the converter comprises conventional counting circuitry and includes a clock generator 60 whose output is coupled to a clock gate 62. When the output of the threshold comparator 54 is high the S input terminal of an R-S flip-flop 64 is enabled and a high output signal generated at the Q output terminal is applied via line 66 to the clock gating circuit 62 in order to gate clock pulses to a pair of serially interconnected binary coded decimal divide by ten counters 68 and 70. Counter 68 is the least significant digit counter. Counter 70 is the higher significant counter and its output is connected to a three-bit counter 72 by means of line 74. The output of the comparator 54 is also connected to a single shot multivibrator circuit schematically shown at 76 by means of line 78. The output states of counter 68 and 70 are connected by a plurality of output lines to their respective 4-bit latch circuits shown schematically at 78 and 80. The latch circuits 78 and 80 are in turn connected to a 4 out of 8 multiplexer circuit 82 (MUX) which is controlled by clock and a clock signal from clock generator 60 and for purposes of simplicity shown only as input lines 84 and 86. A binary coded decimal (BCD) output signal representative of the digitized analog signal is generated at a plurality of output terminals 88 from the multiplexer 82.

As is well known in the art, multiplexer 82 sequentially connects the four outputs of latch circuit 78 to the four output terminals 88 and similarly the four output terminals of latch 80 to output terminals 88 under control of clock and $\overline{\text{clock}}$ signals, respectively. A three-bit latch 90 is similarly connected to a plurality of output terminals from the three-bit counter 72 and is responsive to the control signal from the single shot multivibrator 76 to apply most significant bit (MSB) information at output terminal 92, polarity (POL) data on line 96 and over range (OR), data at output terminal 94. The various control signals employed to control the transmission gates in the analog portion 10 are supplied by a timing waveform generator 98 in response to an initiation pulse received from the counter 70 via line 100. For purposes of simplicity, the specific interconnections to the transmission gates, for example, CMOS gates, are not shown and are merely designated by the letters A-F representing the control pulses shown in FIG. 2 and hereinafter described in greater detail in connection with the operation of the converter of FIG. 1. The signal received via line 100 merely establishes the basic time interval for the timing waveform generator 98. Obviously, additional logic and counter circuits internal to generator 98 provide the specific control signals A-F.

The present invention is shown as a two and one-half digit A-D converter where counters 68 and 70 provide the least and most significant digits, respectively. The MSB signal generated at output terminal 92 corresponds to the one-half digit. However, it is to be understood that the present invention can be easily extended in a well known manner, to cover three and one-half, four and one-half, etc. applications to increase the resolution of the converters.

For purposes of describing the operation of the present invention a full scale voltage range of 0.0 to 199 mV is assumed. In this example, $V_R$ = 200 mV, + V = +5.0V, $V_{THR} \approx$ 2.0V and $V_{IN}$ is greater than −200 mV and less than +200 mV.

In describing the operation of the converter its measuring cycle is divided into five distinct phases. During the phase 1 zero calibration or automatic zero adjustment transmission gates 20 and 45 receive, respectively, high or up control signals C and D in order to be rendered conductive or closed and the remaining transmission gates receive a down or low control signal so as to remain open. In this mode, capacitor 50 is essentially out of the circuit as the output of the source follower 24 is a relatively low impedance and closing of transmission gate 45 provides a DC feedback path between node 40 and node 23. Capacitor 22 is coupled to ground potential and thus input node 18 initially is a zero or ground potential. The threshold voltage of the differential amplifier 32 at terminal 37 is set at $+V/2$. To obtain automatic zero calibration it is necessary that node 34 also be $+V/2$ for a zero input voltage on node 18. This in effect is a calibration of the input capacitor 22. Theoretically, with zero volts or ground potential applied to node 18 no current should flow through resistor 36. Due to the negative DC feedback path between nodes 40 and 23 and the inherent characteristics of operational amplifier 32 with capacitor 50 shunted out of the circuit during this phase, node 34 goes to $+V/2$. Since no current flows through resistor 36 its left hand side must also reside at $+V/2$. In order for this relationship to be satisfied node 23 must reside at $+V/2$ plus the gate to source drop, $V_{GS}$, across source follower 24. Accordingly, a current must flow down through resistor 30 to ground in order to electrically meet these conditions. As a result, node 23 or the voltage across capacitor 22 charges to $+V/2 + V_{GS}$. Therefore, output node 40 is driven to the voltage level indicated by the portion 100 of the upper most waveform in FIG. 2. Thus, during this initial phase an automatic zero calibrating operation is performed and the output node 40 is at $+V/2 + V_{GS}$ in response to the application of zero volts being applied to node 18 by the closing of transmission gate 20 in response to control signal C.

During the next cycle or phase 2 a full scale calibration operation is achieved by closing transmission gates 14, 46 and 48 in response to high or up-control signals A, E, F, respectively. This calibration cycle enables the analog to digital converter of the present invention to automatically measure unknown input voltages $V_{IN}$ of both a positive and negative polarity. The ramp-up operation which begins at point 102 on the upper most waveform of FIG. 2 must be sufficiently negative to insure that point 102 or the ramp-up cycle begins below the threshold voltage $V_{THR}$ of comparator 54. With transmission gate 14 closed the voltage at node 23 goes to the value of $+V/2 + V_{GS} + V_R$ and node 26 resides at $+V/2 + V_R$. Accordingly, a current flows through resistor 36 to node 34 and corresponds to full scale voltage. However, in this instance, an alternate DC feedback path exists between nodes 40 and 34 via the sample and hold circuit 41. Thus, operational amplifier 32 is connected in a unity gain voltage follower configuration. In this condition the additional current created by the application of $V_R$ to node 18, schematically depicted as $I_R$, flows down through resistor 44 to the sample and hold circuit 41. The sample and hold circuit 41 therefore generates and stores a voltage equal to $+V/2 - I_R$ times the value of resistor 44 and applies this value of voltage to node 34 by way of transmission gate 46 and resistor 44. This voltage level is represented by the waveform portion 104. Thus, the sample and hold memory circuit during this portion of the cycle essentially causes a current $I_R$ to flow away from node 34 down through resistor 44. Electrically this is the equivalent of applying a negative value of $V_R$ to that node, i.e., a virtual $-V_R$ reference voltage has been created. With the full scale calibration cycle completed the converter is now ready to begin the up-ramp phase.

During the initial part of phase 3 or the up-ramp portion transmission gates 20 and 46 are closed in response to the application of high control signals C and E, respectively, and all of the other transmission gates are open. In this mode, output node 40 begins ramping up from point 102 to point 106 where it crosses the threshold voltage of comparator 54 as represented by $V_{THR}$. As previously discussed, the comparator output signal opens gate 62 and starts the counting operation.

Nodes 26 and 34 are at a voltage value of $+V/2$ and therefore no current flows through resistor 36. At the beginning of this cycle or at point 102 the output of node 40 is at a voltage value represented by $+V/2 - I_R$ times the value of resistor 44. With all the other gates open during this phase, output node 40 begins ramping up at a rate determined solely by the influence of current $I_R$ flowing down through the resistor 44. This is equivalent to ramping up at a rate represented by $-V_R$. The output node 40 continues the up-ramp at a rate determined by $-V_R$ until it reaches point 108.

During the next cycle or phase 4 gates 16 and 46 are closed or remain closed in response to timing signals B and E, respectively. All the other switches or transmission gates are open. For purposes of illustration, the application of control signal of gating signal B is selected to be after a count of 200 for this two and one-half digit converter. Additionally, the closure of transmission gate 16 in response to control signal B is depicted for three different values of the unknown voltage $V_{IN}$, i.e., for $V_{IN} = V_R$, $V_{IN} = 0$ and $V_{IN} = -V_R$. During final up-ramp the integration is occurring for a predetermined time period equivalent to 200 counts until the up-ramp cycle is completed at point 110.

It is seen that with $V_{IN}$ equal to $+V_R$ the net current at node 34 is zero thus the output node 40 of the integrator is horizontal. Similarly, with $V_{IN} = 0$ the net current at node 34 remains as $-I_R$ flowing down through resistor 44 and therefore the up-ramp continues at the same slope or rate that previously existed before point 108 on the waveform. Finally, if $V_{IN} = -V_R$ the slope of the up-ramp will increase to $-2I_R$ flowing into node 34.

After the up-ramp cycle, the down-ramp cycle begins by opening all the transmission gates except for gate 14 in order to apply a down-ramp proportional to $+V_R$ at output node 40 as illustrated in the top waveform figure of FIG. 2, as is well known in the dual ramp analog to digital art. That is, during the down-ramp cycle the integrating circuit comprising inverting operational amplifier 32 and capacitor 50 is operative to integrate downwardly at a constant rate for an unknown time period, where the period of time is determined by the magnitude of the unknown input voltage $V_{IN}$ until $V_{THR}$ is crossed, at which time flip-flop 64 generates an output signal on line 66 to close gate 62 and terminate the counting operation and similarly the single shot 76 is activated by the rising edge of the output of comparator 54 corresponding to points 120 to strobe the contents of counter 68 and 70 into latch circuit 78 and 80, respectively. Similarly, the contents of counter 72 are strobed into the three-bit latch circuit 90. The $\overline{\text{clock}}$ control signal depicted at 86 can then be used to energize the multiplexer 82 in order to generate a binary coded decimal output number (BCD) representative of the digitized information on the plurality of output lines 88. Similarly, the least significant stage of latch circuit 90 contains information relative to the most significant bit (MSB), at terminal 92, the next stage provides information indicative of the polarity (POL) of the unknown signal $V_{IN}$ at output terminal 94 and the last stage of latch circuit 90 provided over range (OR) data at output terminal 96.

A further understanding of the significance of the information generated by the latch circuit 90 can be understood by examining the last three waveforms of FIG. 2 representing the states of output terminals 92, 94 and 96, during the counting period which extends from the time the up-ramp crossed the threshold level at point 106, until the time the threshold level was crossed by the down ramp voltage generated at the output node 40 at points 120 depending on the value of $V_{IN}$.

The binary value of MSB at 92 represents the value of the half digit. The state of the polarity signal on 96 indicates whether $V_{IN}$ is positive or negative. In the present example an up or one level corresponds to a negative voltage and vice-versa. An up or binary one signal at 94 indicates $V_{IN}$ was less than $-V_R$ or greater than $+V_R$, $-200$ mV and $+200$ mV in this example.

What is claimed is:

1. An analog-digital converter comprising:
  a. input circuit means for receiving an unknown voltage to be digitized and a reference voltage,
  b. an integrating means coupled to said input circuit means, said integrating means having an input and an output which is selectively coupled to said input means
  c. memory means selectively coupled to said input circuit means and said integrating means and responsive thereto for storing a virtual reference voltage of opposite polarity to the reference voltage,
  d. said integrating means being selectively responsive to the reference voltage, the virtual reference voltage, and the unknown voltage for integrating prior and during a predetermined time period and for integrating during a variable time period at a known rate, and
  e. digital circuit means coupled to said integrating means and being selectively enabled during the predetermined and variable time periods for providing a digitized signal indicative of the unknown voltage.

2. An analog-digital converter as in claim 1 wherein:
  a. said memory means comprises an analog storage means.

3. An analog-digital converter as in claim 2 further comprising:
  a. threshold circuit means coupled to the integrating means and to the digital circuit means for selectively enabling said digital circuit means at a predetermined threshold level.

4. An analog-digital converter as in claim 3 further comprising:
  a. first switch means for selectively coupling said analog memory means to said integrating means and to said reference voltage for generating and storing the virtual reference voltage and for generating a first voltage level at an output node of said integrating means, said first voltage level being less than said predetermined threshold level.

5. An analog-digital converter as in claim 4 further comprising:
  a. second switch means for selectively coupling the virtual reference voltage and the unknown voltage to said integrating means prior to and during said predetermined time period.

6. An analog-digital converter as in claim 5 further comprising:
  a. third switch means for selectively coupling the reference supply to said integrating means during said variable time period.

7. An analog-digital converter as in claim 6 wherein:
  a. said second switch means further comprises a plurality of gating means for selectively coupling the virtual reference voltage to said integrating means for integrating at a fixed rate in a first direction until the output node of said integrating means reaches said predetermined threshold level of said threshold circuit means for selectively enabling said digital circuit means, and
  b. said integrating means being further responsive to said virtual reference voltage for integrating in said first direction at the fixed rate for a first predetermined portion of said predetermined time period, and said plurality of gating means being further selectively responsive for coupling the unknown voltage to the integrating means during a second predetermined portion of said predetermined time period.

8. An analog-digital converter as in claim 7 further comprising:
  a. third switch means for selectively coupling the reference voltage to said integrating means after said first predetermined time period for integrating in an opposite direction to said first direction until the output node of said integrating means reaches said threshold voltage for disabling said digital circuit means, and
  b. said digital circuit means including counter means responsive to clock pulses for counting to a digital number during the variable time period, whereby the contents of said counter means at the end of the variable time period constitutes the digitized signal.

9. An analog-digital converter as in claim 8 further comprising:
   a. fourth switch means coupled to said input circuit means and said integrating means and being selectively enabled for generating a calibration voltage at an input node to the integrating means prior to said predetermined time period.

10. An analog-digital converter as in claim 9 wherein:
   a. said integrating means comprises a differential operational amplifier and an integrating capacitor coupled in parallel thereto,
   b. said fourth switch means being selectively enabled for shunting said integrating capacitor and for providing a DC feedback path across said differential operational amplifier for generating the calibration voltage.

11. An analog-digital converter as in claim 10 wherein:
   a. said analog memory means comprises a sample and hold circuit.

12. An analog-to-digital converter comprising: input means for receiving an unknown voltage to be digitized and a reference voltage; an integrator coupled to the input means and having an input and an output, the output being selectively coupled to the input means; memory means selectively coupled to the input of the integrator and the input means and selectively coupled to the output of the integrator, the memory means being for storing a virtual reference voltage of opposite polarity to the reference voltage; threshold circuit means coupled to the integrator; and digital circuit means coupled to the threshold circuit means and being selectively enabled for providing a digitized signal indicative of the unknown voltage, the threshold circuit means selectively enabling the digital circuit means at a predetermined threshold level so that the digital circuit means can at least determine polarity and magnitude of the unknown voltage.

* * * * *